United States Patent [19]

Cole

[11] Patent Number: 4,582,431
[45] Date of Patent: Apr. 15, 1986

[54] OPTICAL MONITOR FOR DIRECT THICKNESS CONTROL OF TRANSPARENT FILMS

[75] Inventor: Barrett E. Cole, Bloomington, Minn.

[73] Assignee: Honeywell Inc., Minneapolis, Minn.

[21] Appl. No.: 540,245

[22] Filed: Oct. 11, 1983

[51] Int. Cl.[4] .............................................. G01B 11/02
[52] U.S. Cl. .................................. 356/382; 356/357; 356/426; 427/10
[58] Field of Search ....................... 356/382, 357, 426; 427/10, 53.1, 166; 390/357, 382, 426

[56] References Cited

U.S. PATENT DOCUMENTS

| | | | |
|---|---|---|---|
| 3,036,491 | 5/1962 | Schier | 356/426 |
| 3,645,771 | 2/1972 | Ward | 427/10 |
| 3,737,237 | 6/1973 | Zurasky | 356/382 |

FOREIGN PATENT DOCUMENTS 1425941  2/1976  United Kingdom ................ 356/382

Primary Examiner—R. A. Rosenberger
Attorney, Agent, or Firm—Alfred N. Feldman

[57] ABSTRACT

Precise thickness control for high performance optical coatings is provided in an optical coating system utilizing an optical monitor. The optical monitor utilizes a light source and detecting arrangement that measures a sample optical element through the expedient of a light path altering structure that is not coincident with the axis of rotation of a deposition carrousel structure that supports optical elements being coated. The light source and detector arrangements can be mounted conveniently outside of the vacuum chamber of the optical coating system.

10 Claims, 4 Drawing Figures

OPTICAL MONITOR FOR DIRECT THICKNESS CONTROL OF TRANSPARENT FILMS

BACKGROUND OF THE INVENTION

Accurate knowledge of material thicknesses deposited on any solid state device is often of critical importance for precise control of the device's operation. This situation is true for all thin-film technologies but it is perhaps most true for a class of coatings known as optical interference coatings. These optical coatings are combinations of different transparent films deposited on a substrate to provide widely varying spectrally-dependent transmission and reflection properties. Optical coatings of many thin-film layers can be used to make narrow band reflectors, transmission filters for discrete wavelength selection, polarizers, and anti-reflection coatings. To obtain the desired interference effects, each coating must be precise in thickness to small fractions of a light wavelength, which in the visible spectrum is on the order of 0.4 to 0.7 microns.

Because of the need to know film thicknesses to a high accuracy, technology has been developed to monitor the thickness of deposited films during the actual deposition process. The technique most widely accepted and used for monitoring thickness during the deposition of optical films is called optical monitoring. The value of this technique lies principally in the fact that the light itself is being used to measure the film thickness. Since the optical properties are of the foremost concern, this technique comes closest to a direct measurement of the desired optical effects.

The underlying principle behind both optical monitoring and optical design is the phenomena of light interference. Light reflecting from each thin-film surface is coherent and interferes differently with light reflected from other surfaces, depending on the precise film thickness, to produce different optical effects. Different combinations of thin films of differing optical thicknesses and refractive indexes can be used to achieve a great variety of optical effects. A multilayer coating is successful if the optical element possesses the desired reflectance or transmittance values over the full useful spectral range. Conversely, the aim in optical monitoring during deposition is to produce the correct film thicknesses by understanding how the reflectance, at one distinct wavelength, is effected by film thickness.

A standard optical coating system consists of a large vacuum chamber (commonly called a box coater because of its shape) within which there are three essential elements: the material deposition source(s), a planetary arrangement holding the parts to be coated, and an optical thickness monitoring system centrally located in the vacuum system. The planetary system has a central axis around which additional planets having sub-axis can rotate. The parts to be coated may number anywhere from a few to many hundreds depending on system and part sizes and are mounted in holders in the planet positions. The parts rotate both about the planet axis and the central axis to maintain deposition quality on all parts within the system to average out any spatially dependent deposition differences. A stationary monitor chip or sample optical element, on which all optical coating measurements are made, is located at the central axis. Light from either a laser or a focused monochromatic light source is directed onto this monitor chip and then reflected back to a detector. As the film thickness on the monitor chip changes, the reflected signal varies.

In the optical industry it is not unheard of to need as many as 50 to 100 layers to produce a critical optical effect. An error in thickness of any of these layers can have dire consequences for the finished elements optical performance. Unfortunately, as the succeeding layers are deposited on the monitor chip the information learned about the thickness of the last layer diminishes readily because of the complex interference effects between all succeeding layers. In addition, the thickness sensitivity of the monitoring process to the last layer is significantly impaired. For example, in fabricating a narrow band reflector with ten high index/low index ¼-wave thin-film pairs, the reflectivity might change from 4% to 37% after deposition of the first film pair on glass. Final reflectivity of 99.99% is realized after the tenth pair is deposited, but an undetectable reflectivity increase of only 0.01% occurs when the tenth and last thin-film pair is deposited. To avoid this problem it is a standard practice in the optical coating industry to periodically replace the coated chip with a clean chip during the deposition process.

SUMMARY OF THE INVENTION

A rotary optical monitoring system invariant to most deposition fluctuations is disclosed in the present invention and has been operated in thin film research. The principle of operation is that the monitor chip or sample optical element, rather than being stationary and isolated from the parts, is contained in a single axis carrousel along with all of the other parts to be coated. The monitor chip rotates along with the other parts and is monitored continuously during the deposition process to provide continuous information on the actual part thickness. A rotation frequency in the tens of revolutions per minute range is sufficient to average all significant system fluctuations for most processes. In multiple axis types of arrangements where planetary carrousels are utilized, by proper optical means a sample optical element that is typical of the average of the optical elements being coated can be monitored.

Light is directed into the vacuum system after first passing through a beam splitter and a slanted window to avoid unwanted retroreflected signals. The monochromatic radiation is directed down the central axis of the carrousel and reflects off of two 45 degree mirrors, which direct the focus radiation onto the monitor chip or sample optical element. It is also possible to use a light path altering means to intercept the radiation that is directed downward and project it to a sample optical element that is mounted on one of the planetary carrousel segments. The light reflected back from the monitor chip/film combination passes back through the optical system and is deflected by the beam splitter onto the detector. Alignment of all of the elements is critical to avoid undesirable processing of the reflected beam with carrousel rotation.

It is possible to provide for each thin-film group with a new uncoated monitor chip or sample optical element by subsequently loading a fresh sample optical element onto the carrousel monitor chip platform after pneumatically ejecting its predecessor. This change in monitor chip or sample optical element can be accomplished by any convenient structure after the carrousel has been brought to a stationary condition. The previously coated monitor chip is ejected into a catcher for future recovery. After a chip change, the carrousel rotation is restarted and the process continues with the deposition of the next two or three layer thin-film group.

In accordance with the present invention, there is also provided an optical monitor for use in conjunction with chamber means in which transparent films are deposited upon optical elements with said optical monitor being capable of making direct thickness measurements of said transparent films including: deposition carrousel means mounted for rotation about an axis within said chamber means; said deposition carrousel means adapted to support said optical elements at a distance from said axis during deposition of said optical elements with said transparent films while said deposition carrousel means rotates to assure a uniform film deposition on said optical elements; light path altering means mounted upon said deposition carrousel means to direct light from said axis of rotation of said deposition carrousel means to a sample optical element mounted at a distance from said axis generally corresponding to the distance of said other optical elements; said sample optical element being monitored while said transparent films are deposited upon said optical elements; and light source and detector means mounted with respect to said chamber means with said light source and detector means operatively acting along said axis of said deposition carrousel means, and further operatively acting through said light path altering means to directly measure the thickness of said transparent films on said sample optical element.

DESCRIPTION OF THE PREFERRED EMBODIMENTS

Figure 1:
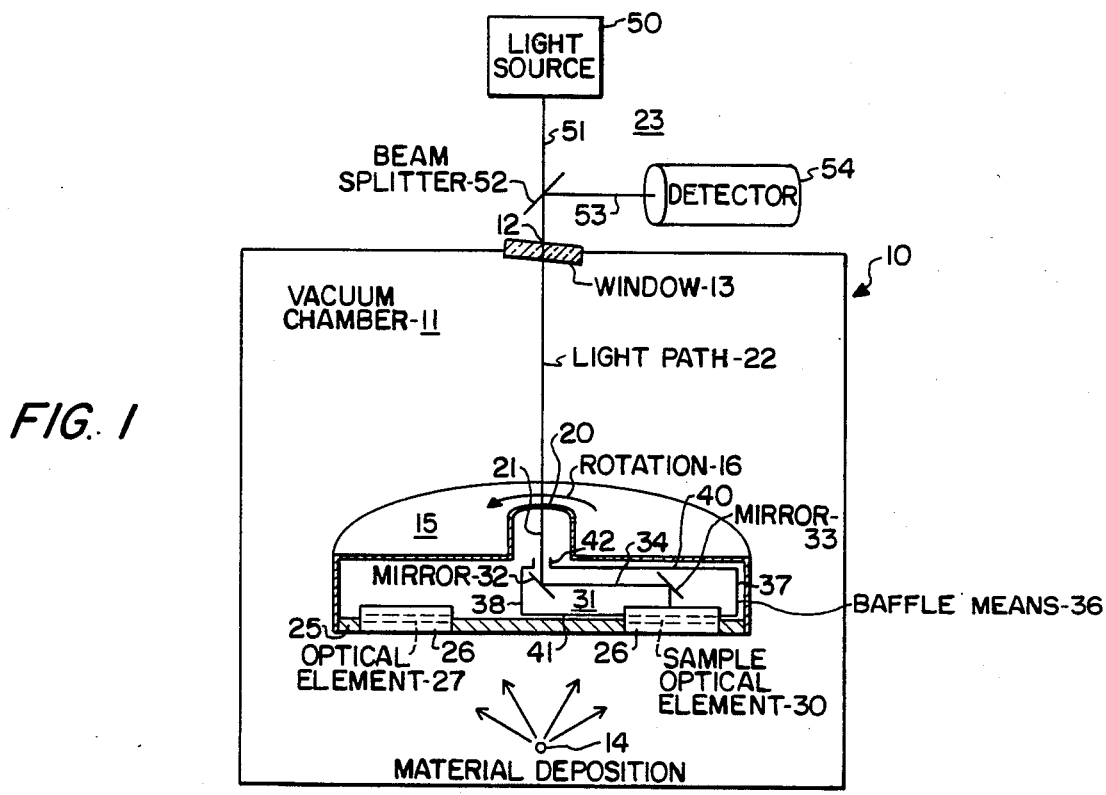
FIG. 1 is a pictorial representation of a deposition chamber with an optical monitor.

In FIG. 1 there is pictorially disclosed an optical coating system. The optical coating system is generally indicated at 10 and is sometimes referred to as a box coater. The optical coating system 10 includes a vacuum chamber 11 that is optically accessed at 12 through a window 13. The window 13 is tilted at a slight angle so that incident light will not interfere with the optical monitoring system that is to be disclosed. Within the vacuum chamber 11 is a material deposition source means 14 which has been disclosed as a single deposition source. This single deposition source could, in fact, be a multiple source for different materials as is well known in connection with optical coating systems. A single source has been shown at 14 for simplicity sake.

Mounted above the source means 14 is a deposition carrousel means 15. The carrousel means 15 is supported for rotation as indicated by the arrow 16 and has a central opening 20. The carrousel means 15 is mounted for rotation around a center axis 21 which is coincident with a light path 22. The light path will be described in more detail in connection with a light source and detector means generally disclosed at 23. The carrousel means 15 rotates around the axis 21 and is supported for rotation by any convenient mechanical system, which is not shown and which is not part of the present invention. Any number of mechanical structures could be used for support of the carrousel means 15 and be capable of providing rotation of the carrousel means 15 around the axis 21.

Within the carrousel means 15 is a lower platform 25 which supports a number of receptacles 26 that are each at the same radius from the central axis 21. Each of the receptacles 26 supports an optical element 27 which is to be coated within the device. One of the receptacles 26 includes a sample optical element 30 that is monitored in the present system, as will be described in detail. The sample optical element 30 is capable of being ejected from the receptacle 26 by a stationary pneumatic mechanism that has not been shown, and is not part of the present invention. Sample optical elements 30 can be changed at any time through the means of the pneumatic ejector and a fresh sample optical element 30 is dropped in place from a magazine of these elements within the optical coating system 10. The number of optical elements 27 that are coated can vary from a few elements in a small coating system to many elements in larger systems as will be described in connection with FIGS. 3 and 4.

Supported on the platform 25 is a light path altering means 31 that includes a pair of mirrors 32 and 33 that are placed with reflective surfaces that are parallel and with the first mirror 32 in line with the central axis 21. With the mirrors 32 and 33 in place, the center of the sample optical element 30 is visible along the axis 21 of the light path 22, and this light path is shown extended at 34 to show how the light path 22 would reflect from the mirror 32, to the mirror 33, and thence to the sample optical element 30.

In order to protect the light path altering means 31 from becoming coated during the operation of the optical coating system 10, baffle means 36 is provided which substantially encloses the receptacle 26 of the sample optical element 30, and the mirrors 32 and 33. The baffle means 36 has end walls 37 and 38, along with a top 40, and a bottom 41. The bottom 41 could, in fact, be the platform 25 while the top 40 could, be a portion of the deposition carrousel means 15. For simplicity sake, the entire baffle means is shown at 36 as an enclosed chamber with an opening that corresponds to the receptacle for the sample optical element 30, and a further opening 42 that lies along the light path 22 of the rotational axis 21. As such, it is apparent that the baffle means 36 provides an enclosed chamber to protect the mirrors 32 and 33 as well as their support structures (not shown) so that they are not coated during the actual deposition of material on the optical elements 27.

The optical monitor for the optical coating system 10 is completed by the following details of the light source and detector means 23. The light source and detector means 23 includes a light source 50 that can be any type of conventional light source such as a laser, or a focused monochromatic light source. The light source 50 directs a light beam 51 coincident with the axis of rotation 21 along the light paths 22 and 34. The light passes through a beam splitter 52 and travels to the mirror 32, to the mirror 33, and then to the sample optical element 30. As light is reflected it is reflected back along this same light path to the beam splitter where a detected light beam 53 is provided to a detector means 54. The light source and detector means 23 are made up of optical monitoring elements that are now in use and commercially available, and will not be described in more detail.

The operation of the optical coating system 10 is quite straightforward. The deposition carrousel means 15 is placed into rotation and a material deposition source means 14 is activated to begin coating the optical elements 27. At the same time a coating will be placed on the sample optical element 30. The light source 50 provides light along the light path 22 which is coincident with the axis of rotation. The light travels to the first mirror 32 and then is reflected to the second mirror 33 where it is directed to the surface of the sample optical element 30. As a coating builds up, the light reflected back along the light path 22 to the beam splitter 52 and thence to the detector 54 will show a variance from the light being provided by the light source 50. The amount of variance is a function of the coating parameters on the sample optical element 30. The coating that is being placed on the optical element can be directly measured. Prior devices have relied on an average of a sample in the center of the optical coating system 10, and in certain types of large systems this type of average sampling is not sufficiently accurate for good control of the coating being placed on an optical element. As can be seen, the sample optical element 30 is being coated under the same conditions as the optical elements 27 that are the end product of the optical coating system 10. With the arrangement disclosed very accurate control of the transparent films on the optical elements is possible.

Figure 2:
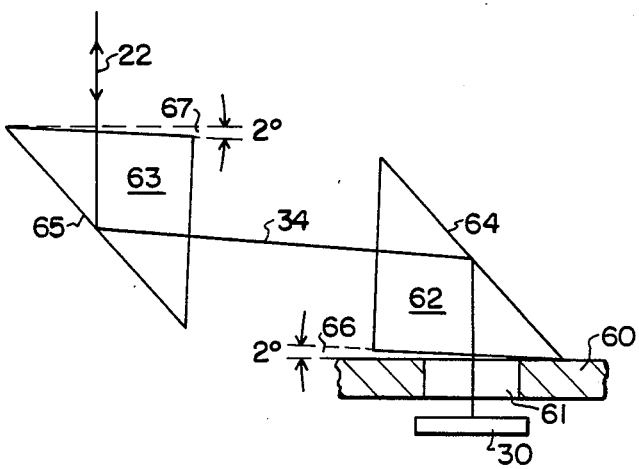
FIG. 2 is a pair of prisms adapted to replace the mirrors in FIG. 1.

The use of the mirrors 32 and 33 in a system of the type disclosed in FIG. 1 have led to certain types of errors. The errors occur as the polarization of the light striking the mirror 32 varies with rotation, and as such the output signal from the detector 54 has some variations that are undesirable. Typically the mirrors 32 and 33 would be aluminum reflecting mirrors and the polarization or change in polarization of light returning to the detector provided minor variations due to this polarizing effect. In FIG. 2 an improved prism arrangement for reflecting the light is shown as a replacement for the mirrors 32 and 33. The light path 22 is again shown along with its extension 34 to a sample optical element 30. A support 60 that in turn rides on the platform 25 is provided, and the support has a hole 61 that allows access of the light path to the sample optical element 30. On the support 60 there is a first prism 62 that coacts with a second prism 63. The internal reflecting surface 64 of the prism 62 is aligned with the internal reflecting surface 65 of the prism 63. Each of the prisms 62 and 63 are mounted in this optical system with a slight tilt with respect to the optical path 22. The tilt is shown at 66 and 67 as being approximately 2 degrees. This tilt is provided to keep light reflections within the vacuum chamber from being reflected back through the optical window 13. The tilt in some aspects is similar to the fact that the window 13 is placed in a slightly tilted fashion and the vacuum chamber 11.

The system of FIG. 2 avoids any problems with differing reflective areas of polarized light from the reflecting surfaces by taking advantage of the 100% reflectance of internal reflection for both polarizations. The prisms 62 and 63 are mounted slightly off of a normal so that unwanted prism surface reflections do not reach the detector 54. Either antireflective coatings or non-normal prism surfaces as shown, would also suffice to reduce the unwanted reflections.

Figures 3, 4:
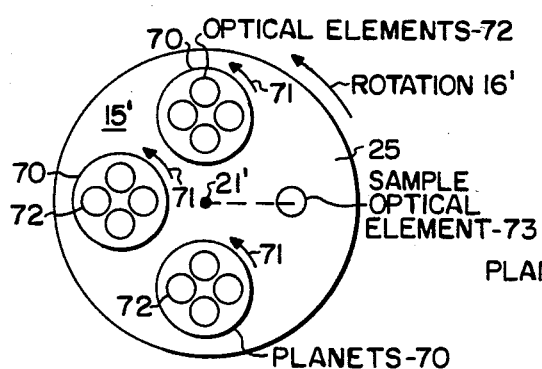
FIG. 3 is a deposition carrousel means including planetary arrangements.
FIG. 4 is a modification of the device of FIG. 3.

In FIGS. 3 and 4 two additional versions of the deposition carrousel means have been disclosed. In FIG. 3 the deposition carrousel means is disclosed at 15' and has a center of rotation 21' that corresponds with the axis 21 of FIG. 1. A platform 25 is again shown, but in this case a plurality of planets 70 are schematically shown as being mounted on the platform 25. Each of the planets 70 rotates as indicated at 71 while the main deposition carrousel means 15' rotates as indicated at 16'. Each of the planets 70 contain a plurality of optical elements disclosed at 72. Each of the planets 70 is shown as containing four optical elements but the number is not intended as a limitation. The number of optical elements 72 in each of the planets 70 is a matter of design choice and will vary depending on the type of optical coating system 10 being utilized, and the type and size of optical elements 72 being coated. The axis of rotation 21 again provides a center for the optical path (not shown in FIG. 3) that reflects to a sample optical element 73 that is mounted to rotate with the platform 25. In this particular configuration the coating on the sample optical element 73 will be an average of the coatings obtained during the rotation, but does not directly correspond to each of the optical elements 72 being coated. This can be overcome as is disclosed in FIG. 4.

In FIG. 4 is disclosed a carrousel means 15" with rotation indicated at 16". The optical deposition carrousel means 15" has four planetary optical element holders 75 which each are shown as including provision for mounting three optical elements 76 on each of the planets 75. The direction of rotation is again disclosed at 77 for each of the planets 75. A central axis of rotation 21" is shown with an optical path to a sample optical element 78 that is mounted on one of the planets 75. With this arrangement the optical elements on the planets 75 can be measured as they rotate to provide a good average of the coating being placed on all of the elements that rotate on planets 75 that are at an equal radius on the platform 25 from the central axis of rotation 21".

As has been indicated, a number of possible variations of physical structures are available utilizing the inventive concept disclosed in the present application. Since many variations of the light path altering means and the deposition carrousel means for the optical monitor of the present invention are possible, the applicant wishes to be limited in the scope of his invention solely by the scope of the appended claims.

The embodiments of the invention in which an exclusive property or right is claimed are defined as follows:

1. An optical monitor for use in conjunction with chamber means in which transparent films are deposited upon optical elements with said optical monitor being capable of making direct optical thickness measurements of said transparent films, including:
   deposition carrousel means mounted for rotation about an axis within said chamber means;
   material deposition source means mounted in a fixed position within said chamber means;
   said deposition carrousel means adapted to support said optical elements at a distance from said axis during deposition of said optical elements with said transparent films while said deposition carrousel means rotates to assure a uniform film deposition on said optical elements;
   light path altering means mounted upon said deposition carrousel means to direct light from said axis of rotation of said deposition carrousel means to a sample optical element mounted at a distance from said axis generally corresponding to said distance of said other optical elements;
   said sample optical element being monitored while said transparent films are deposited upon said optical elements;

and light source and detector means mounted with respect to said chamber means with said light source and detector means operatively acting along said axis of said deposition carrousel means, and further operatively acting through said light path altering means to directly measure the thickness of said transparent films on said sample optical element.

2. An optical monitor as described in claim 1 wherein said chamber means is a vacuum chamber means including a window; and said light source and detector means is mounted external to said chamber means and is operatively acting through said window.

3. An optical monitor as described in claim 2 wherein said light path altering means includes optical path means having at least two light reflecting surfaces; and light reflecting surfaces being oriented to cause said light from said light source and detector means to reflect from said axis of rotation to said sample optical element.

4. An optical monitor as described in claim 3 wherein said two light reflecting surfaces include a pair of mirrors.

5. An optical monitor as described in claim 4 wherein said two mirror surfaces are generally parallel to each other.

6. An optical monitor as described in claim 5 wherein said light path altering means further includes baffle chamber means which substantially encloses said light path altering means, and a surface of said sample optical element remote from a surface to be coated by said transparent films; said baffle chamber means protecting said mirrors and said remote surface during the deposition of said transparent films.

7. An optical monitor as described in claim 3 wherein said two light reflecting surfaces are parts of a pair of prisms.

8. An optical monitor as described in claim 7 wherein said two light reflecting surfaces are generally parallel to each other.

9. An optical monitor as described in claim 8 wherein said light path altering means further includes baffle chamber means which substantially encloses said light path altering means, and a surface of said sample optical element remote from a surface to be coated by said transparent films; said baffle chamber means protecting said mirrors and said remote surface during the deposition of said transparent films.

10. An optical monitor as described in claim 2 wherein said deposition carrousel means includes planetary carrousel means mounted at a radius from said axis; said planetary carrousel means adapted to support optical elements at a distance from an axis of said planetary carrousel means; and said planetary carrousel means rotating about said planetary carrousel axis while said deposition carrousel means rotation during deposition of said optical elements.

* * * * *